US009622303B1

(12) United States Patent
Wang

(10) Patent No.: US 9,622,303 B1
(45) Date of Patent: Apr. 11, 2017

(54) CURRENT MIRROR AND CONSTANT-CURRENT LED DRIVER SYSTEM FOR CONSTANT-CURRENT LED DRIVER IC DEVICE

(71) Applicant: NXP B.V., Eindhoven (NL)

(72) Inventor: Ge Wang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/861,385

(22) Filed: Sep. 22, 2015

(51) Int. Cl.

*H03K 5/151* (2006.01)
*H03K 5/24* (2006.01)
*G06F 1/06* (2006.01)
*H05B 33/08* (2006.01)

(52) U.S. Cl.

CPC ................................ *H05B 33/0815* (2013.01)

(58) Field of Classification Search

None

See application file for complete search history.

(56) References Cited

U.S. PATENT DOCUMENTS

2005/0285676 A1 12/2005 Jones
2007/0013438 A1 1/2007 Chuang
2007/0236285 A1 10/2007 Felder
2011/0215727 A1 9/2011 Liu et al.
2014/0097762 A1 * 4/2014 Ide ..................... H05B 33/0806 315/192
2014/0197747 A1 7/2014 Martini et al.

FOREIGN PATENT DOCUMENTS

CN 202587508 U 12/2012
EP 0658834 A2 * 6/1995 ............. G05F 3/262

OTHER PUBLICATIONS

Kaur, Parneet et al.; "Low Power Low Noise CMOS Chopper Amplifier"; International Journal of Electronics and Computer Science Engineering, vol. 1, No. 2; pp. 734-740 (2010).
STLED25—5 Channels step-up white LED driver; DocID 022323, Rev. 3; 30 pgs.; May 2012.
STP4CMP—Low voltage 4-channel constant current LED driver with charge pump; DocID 15770, Rev. 3; 24 pgs; Apr. 2015.
Texas Instruments; "6-Channel Current Regulator for LED Backlight Application"; SNVS498D—Apr. 2007—Revised May 2013; 27 pgs.
Texas Instruments; "TPS92640/TPS92641 Synchronous Buck Controllers for PRecision Dimming LED Drivers"; 28 pages Oct. 2012.

* cited by examiner

*Primary Examiner* — Dedei K Hammond

(57) ABSTRACT

Embodiments of a current mirror for a constant-current light-emitting diode (LED) driver system and a constant-current LED driver integrated circuit (IC) device having the current mirror are described. In one embodiment, a current mirror includes at least one current mirror cell. Each of the at least one current mirror cell includes semiconductor circuits configured to generate an output current based on a reference current and a control module configured to alternately and continuously charge the semiconductor circuits in response to non-overlapping clock signals.

16 Claims, 5 Drawing Sheets

CURRENT MIRROR AND CONSTANT-CURRENT LED DRIVER SYSTEM FOR CONSTANT-CURRENT LED DRIVER IC DEVICE

BACKGROUND

Accurate current generation is useful for a variety of circuits. For example, constant-current light-emitting diode (LED) drivers can be used in an LED lighting system to provide stable current for multiple LED strings. However, for a conventional current generation circuit utilizing device matching techniques, matching accuracy can fluctuate over process, voltage, and temperature (PVT) variations.

SUMMARY

Embodiments of a current mirror and an LED driver system having the current mirror are described. In one embodiment, a current mirror includes at least one current mirror cell. Each of the at least one current mirror cell includes semiconductor circuits configured to generate an output current based on a reference current and a control module configured to alternately and continuously charge the semiconductor circuits with non-overlapping clock signals.

In an embodiment, the semiconductor circuits include first and second semiconductor circuits, which are connected to a voltage rail, to a reference current signal path from which the reference current is received, and to a current output signal path to which the output current is output.

In an embodiment, when one of the first and second semiconductor circuits is charged by the reference current, the other one of the first and second semiconductor circuits generates the output current.

In an embodiment, the output current is equal to the reference current over process, voltage, and temperature variations.

In an embodiment, the control module includes a first control circuit and a second control circuit. The first control circuit includes a first set of switches connected to a gate terminal of the first semiconductor circuit, connected to the reference current signal path, and connected to the current output signal path. The second control circuit includes a second set of switches connected to a gate terminal of the second semiconductor circuit, connected to the reference current signal path, and connected to the current output signal path.

In an embodiment, each of the first and second sets of switches are configured to be controlled by a first clock signal and a second clock signal, and the first clock signal does not overlap with the second clock signal.

In an embodiment, the first semiconductor circuit includes a first PMOS device, and the second semiconductor circuit includes a second PMOS device.

In an embodiment, the first control circuit includes a first switch connected between a gate terminal of the first PMOS device and a drain terminal of the first PMOS device, a second switch connected between the drain terminal of the first PMOS device and the reference current signal path, and a third switch connected between the drain terminal of the first PMOS device and the current output signal path.

In an embodiment, the second control circuit includes a fourth switch connected between a gate terminal of the second PMOS device and a drain terminal of the second PMOS device, a fifth switch connected between the drain terminal of the second PMOS device and the reference current signal path, and a sixth switch connected between the drain terminal of the second PMOS device and the current output signal path.

In an embodiment, the first, second, and sixth switches are configured to be controlled by the first clock signal, and the third, fourth, and fifth switches are configured to be controlled by the second clock signal.

In an embodiment, a constant-current LED driver integrated circuit (IC) device includes the current mirror, a reference current generator, and LED driver circuits.

In an embodiment, each of the LED driver circuits includes resistors, an error amplifier, and switches.

In an embodiment, the error amplifier includes a frequency chopping unit configured to perform frequency chopping to reduce an input offset of the error amplifier.

In an embodiment, a LED system includes the constant-current LED driver IC device and LED diode strings.

In an embodiment, a current mirror for a constant-current LED driver system includes current mirror cells. Each of the current mirror cells includes a first PMOS device and a second PMOS device configured to generate an output current based on a reference current and a control module configured to alternately and continuously charge the first and second PMOS devices in response to non-overlapping clock signals.

In an embodiment, the first and second PMOS devices are connected to a voltage rail, connected to a reference current signal path from which the reference current is received, and connected to a current output signal path to which the output current is output. When one of the first and second PMOS devices is charged by the reference current, the other one of the first and second PMOS devices generates the output current.

In an embodiment, the output current is equal to the reference current over process, voltage, and temperature variations.

In an embodiment, a constant-current LED driver integrated circuit (IC) device includes a current mirror, a reference current generator and LED driver circuits. A current mirror includes current mirror cells. Each of the current mirror cells includes a first PMOS device and a second PMOS device configured to generate an output current based on a reference current and a control module configured to alternately and continuously charge the first and second PMOS devices in response to non-overlapping clock signals. The reference current generator is configured to generate the reference current. The LED driver circuits are configured to generate LED driving currents based on output currents generated by the current mirror.

In an embodiment, each of the LED driver circuits includes resistors, an error amplifier, and switches.

In an embodiment, the error amplifier includes a frequency chopping unit configured to perform frequency chopping to reduce an input offset of the error amplifier.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
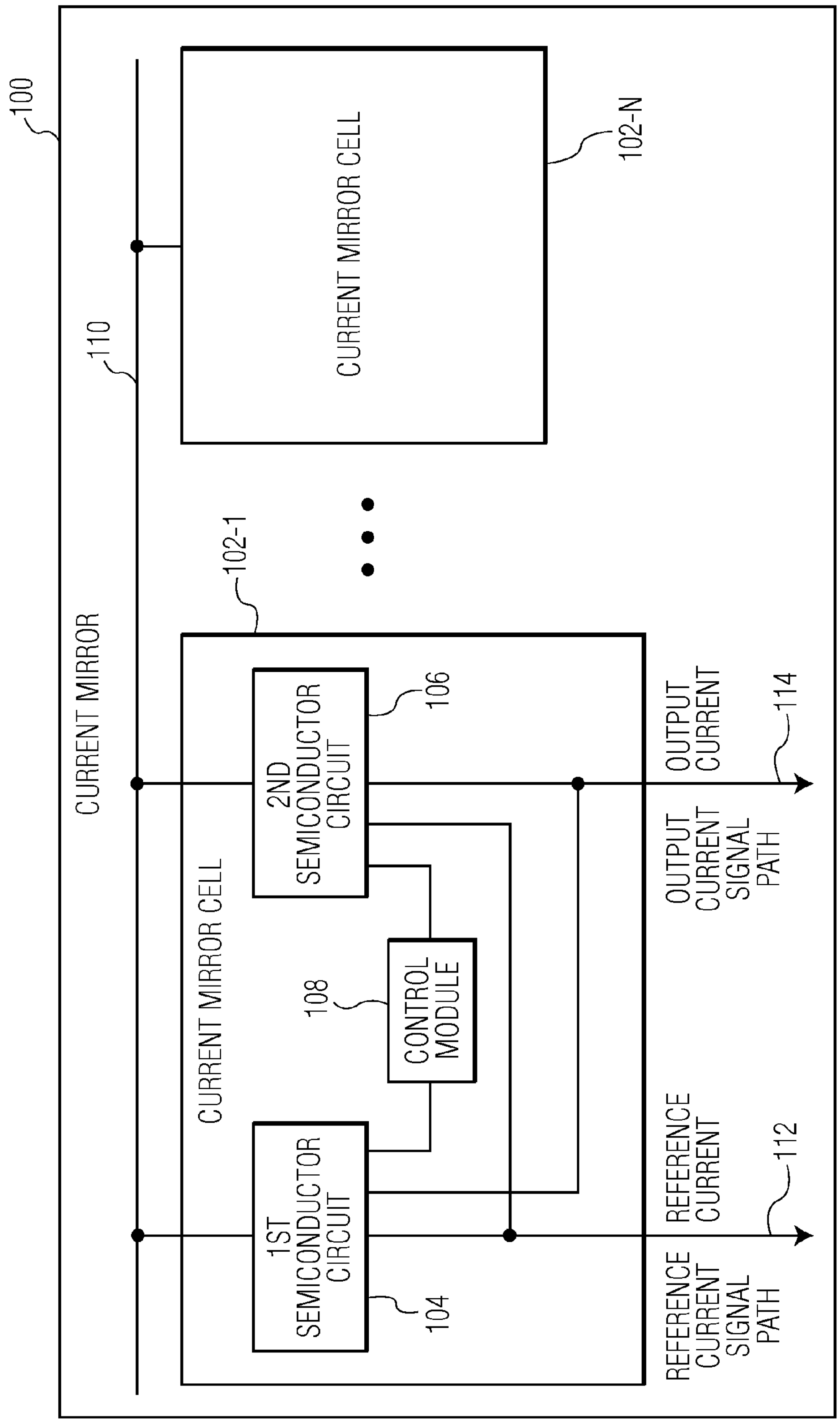
FIG. 1 is a schematic block diagram of a current mirror for a constant-current LED driver system in accordance with an embodiment of the invention.

FIG. 1 is a schematic block diagram of a current mirror 100 in accordance with an embodiment of the invention. In the embodiment depicted in FIG. 1, the current mirror includes one or more current mirror cells 102-1, . . . , 102-N, where N is a positive integer. The current mirror is typically provided as a component of an Integrated Circuit (IC) device, such as a constant-current LED driver IC device. The current mirror can be integrated within an electronic device, such as an LED system. The current mirror can generate at least one output current based on at least one corresponding reference current. For example, each current mirror cell generates an output current based on a corresponding reference current.

The current mirror 100 depicted in FIG. 1 can be used in a variety of circuits. In some embodiment, the current mirror is used in an LED system to provide accurate current for LED driver circuits. LEDs are widely accepted as an energy efficient light source. For example, some applications such as backlighting use multiple LED strings. Constant-current LED drivers are commonly used in LED lighting systems due to the wide acceptance of the LEDs as an energy efficient light source. However, a LED lighting system with multiple LED strings typically require relatively accuracy LED driver current.

The current mirror 100 can generate relatively accurate current output for one or more circuits, such as LED driver circuits. Compared to a conventional current mirror utilizing device matching techniques, the current mirror can generate a highly accurate current output while maintaining minimal channel-to-channel mismatch between two reference current outputs. For example, a conventional current mirror that utilizes device matching techniques can provide a matching accuracy of around 1% with advanced techniques such as active current cascoding. For a conventional current mirror, it is difficult to get a better result without dramatic device size increases or other expensive techniques. In addition, for a conventional current mirror, such matching accuracy can vary over process, voltage, and temperature changes. Compared to a conventional current mirror, the current mirror can improve the matching accuracy (e.g., to 0.5%) without a significant increase in die area. In addition, the matching accuracy of the current mirror stays at more accurate levels and may not even change over process, voltage, and temperature variations.

In the embodiment depicted in FIG. 1, the current mirror cell 102-1 includes a first semiconductor circuit 104, a second semiconductor circuit 106, and a control module 108 for controlling the first and second semiconductor circuits. In an embodiment, the first semiconductor circuit includes a first PMOS device and the second semiconductor circuit includes a second PMOS device. Although the current mirror cell is shown in FIG. 1 as including two semiconductor circuits, in other embodiments, the current mirror cell includes more than two semiconductor circuits.

In some embodiments, the control module 108 of the current mirror cell 102-1 is configured to alternately and continuously charge the first and second semiconductor circuits 104, 106 with non-overlapping clock signals. The first and second semiconductor circuits may be connected to a voltage rail 110, to a reference current signal path 112, and to a current output signal path 114. In an embodiment, when one of the first and second semiconductor circuits is charged by a reference current that is received from the reference current signal path, the other one of the first and second semiconductor circuits generates an output current that is output from the current output signal path. The output current may be equal to the reference current over process, voltage, and temperature variations.

Figure 2:
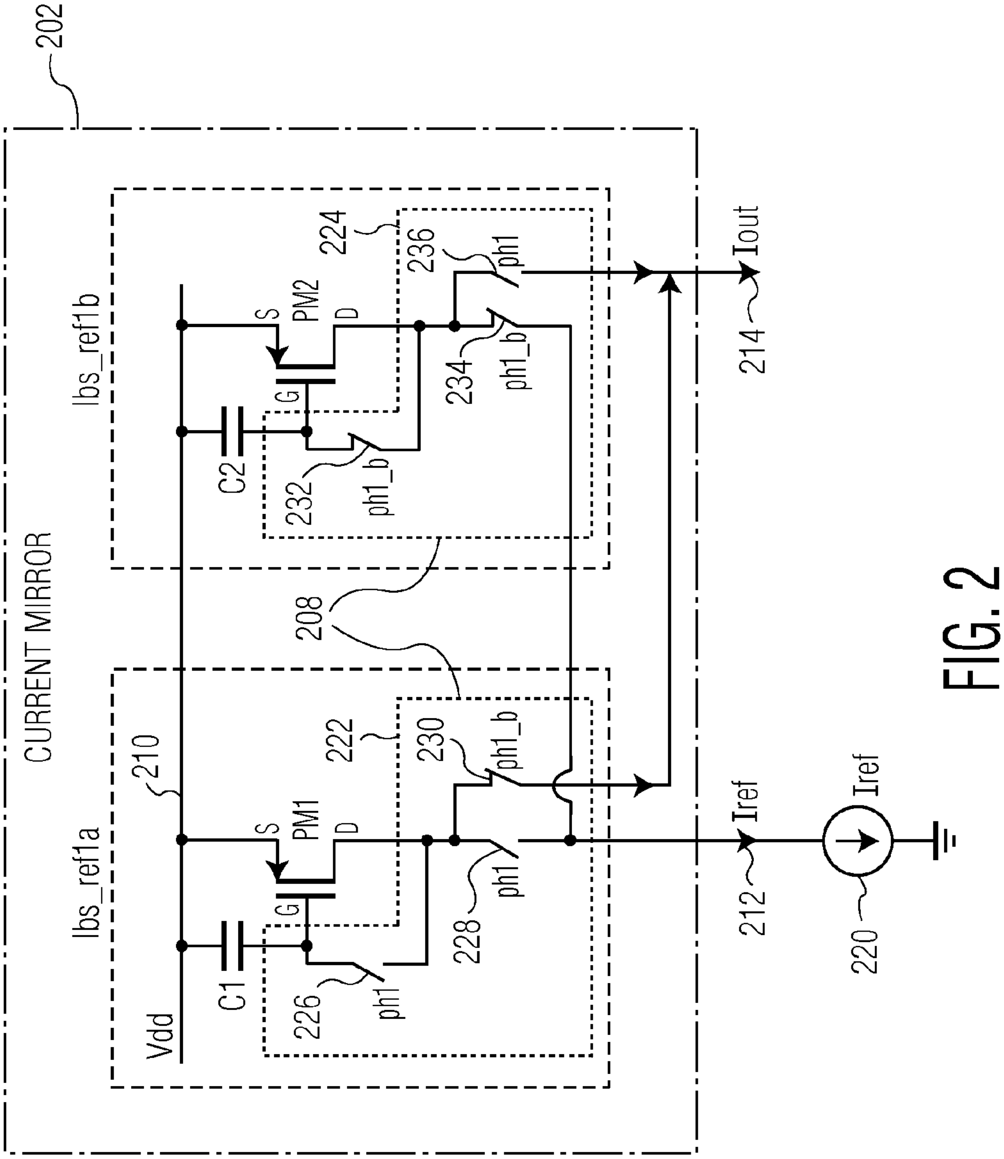
FIG. 2 depicts an embodiment of a current mirror cell of the current mirror depicted in FIG. 1.

FIG. 2 depicts an embodiment of the current mirror cell 102-1 of the current mirror 100 depicted in FIG. 1. In the embodiment depicted in FIG. 2, a current mirror cell 202 includes a first PMOS device, "PM1," (e.g., the first semiconductor circuit 104), a second PMOS device, "PM2," (e.g., the second semiconductor circuit 106) and a control module 208 for controlling the first and second PMOS devices. The current mirror cell depicted in FIG. 2 is one possible embodiment of the current mirror cell depicted in FIG. 1. However, the current mirror cell depicted in FIG. 1 is not limited to the embodiment shown in FIG. 2.

Figure 3:
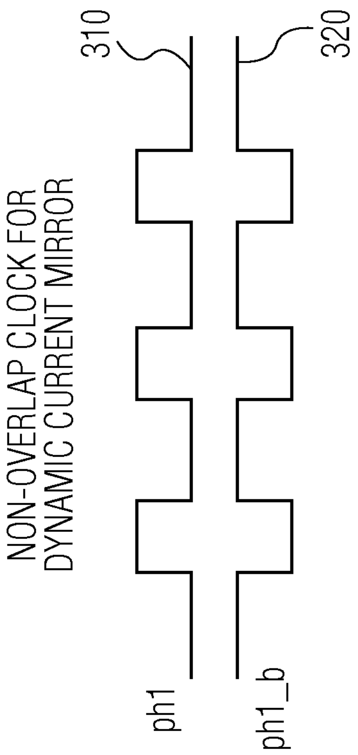
FIG. 3 depicts exemplary waveforms of clock signals used in the current mirror cell depicted in FIG. 2.

In the current mirror cell 202 depicted in FIG. 2, the control module 208 is configured to alternately and continuously charge the first and second PMOS devices, PM1, PM2, with non-overlapping clock signals, "ph1," "ph1_*b*." In some embodiments, the clock signal, ph1, is an inverted version of the clock signal, ph1_*b*. FIG. 3 shows exemplary time-synchronized waveforms of the clock signals, ph1, ph1_*b*, that are applied to the control module 208. As shown in FIG. 3, the clock signals, ph1, ph1_*b*, are square waves that do not overlap with each other (e.g., in time). Although the clock signals, ph1, ph1_*b*, are shown in FIG. 3 as square waves, in other embodiments, other waveforms (e.g., sine, triangle, and sawtooth waveforms) can also be used.

Turning back to FIG. 2, source terminals, "S," of the first and second PMOS devices, PM1, PM2, are connected to a voltage rail 210 with a voltage, "$V_{dd}$," while source terminals, "S," of the first and second PMOS devices, PM1, PM2, are connected to a reference current signal path 212 and connected to a current output signal path 214. When one of the first and second PMOS devices is charged by a reference current, "$I_{ref}$," that is received from the reference current signal path, the other one of the first and second PMOS devices generates an output current, "$I_{out}$," that is output from the current output signal path. The output current, $I_{out}$, is equal to the reference current, $I_{ref}$, over process, voltage, and temperature variations. In the embodiment depicted in FIG. 2, the reference current, $I_{ref}$, is generated by a current source 220 that is external to the current mirror cell 202. However, in some embodiments, the reference current, $I_{ref}$, may be generated by a current source that is integrated in the current mirror cell.

In the embodiment depicted in FIG. 2, the control module 208 includes a first control circuit 222 and a second control circuit 224. The first control circuit and the first PMOS device, PM1, form a first current mirror segment, "lbs_ref1*a*." The first control circuit includes a first set of switches, 226, 228, 230, which are connected to a gate terminal, "G," of the first PMOS device, PM1, connected to the reference current signal path 212, and connected to the current output signal path 214. The first control circuit includes the first switch 226 connected between the gate terminal, G, of the first PMOS device, PM1, and a drain terminal, "D," of the first PMOS device, PM1, the second switch 228 connected between the drain terminal, D, of the first PMOS device, PM1, and the reference current signal path, and the third switch 230 connected between the drain terminal, D, of the first PMOS device, PM1, and the current output signal path.

The second control circuit 224 and the second PMOS device, PM2, form a second current mirror segment, "lbs_ref1*b*." The second control circuit includes a second set of switches, 232, 234, 236, which are connected between a gate terminal, "G," of the second PM device, PM2, connected to the reference current signal path, and connected to the current output signal path. The second control circuit includes the fourth switch 232 connected between the gate terminal, G, of the second PMOS device, PM2, and the drain terminal, "D," of the second PMOS device, PM2, the fifth switch 234 connected between the drain terminal, D, of the second PMOS device, PM2, and the reference current signal path, and the sixth switch 236 connected between the drain terminal, D, of the second PMOS device, PM2, and the current output signal path.

In the control module 208 depicted in FIG. 2, each of the first and second sets of switches 226, 228, 230 and 232, 234, 236, are configured to be controlled by a first clock signal, ph1, and a second clock signal, ph1_*b*, which does not overlap with the second clock signal, ph1_*b*. As shown in FIG. 2, the first, second, and sixth switches 226, 228, 236 are configured to be controlled by the first clock signal, ph1, while the third, fourth, and fifth switches 230, 232, 234 are configured to be controlled by the second clock signal, ph1_*b*.

In an exemplary operation of the current mirror 202, the first and second PMOS devices, PM1, PM2, are alternatively charged or discharged under the control of inversing clock signals, ph1, ph1_*b*. When one of the first and second PMOS devices is charged by the reference current, $I_{ref}$, that is received from the reference current signal path 212, the other one of the first and second PMOS devices generates an output current, $I_{out}$, that is output from the current output signal path 214. Consequently, the current mirror can generate relatively accurate current output. Compared to a conventional current mirror utilizing device matching techniques, the current mirror can generate a highly accurate current output while maintaining minimal channel-to-channel mismatch between two reference current outputs. For example, under both the clock signal, ph1, and the clock signal, ph1_*b*, the output current, $I_{out}$, can be equal to the reference current, $I_{ref}$, over process, voltage, and temperature variations.

Figure 4:
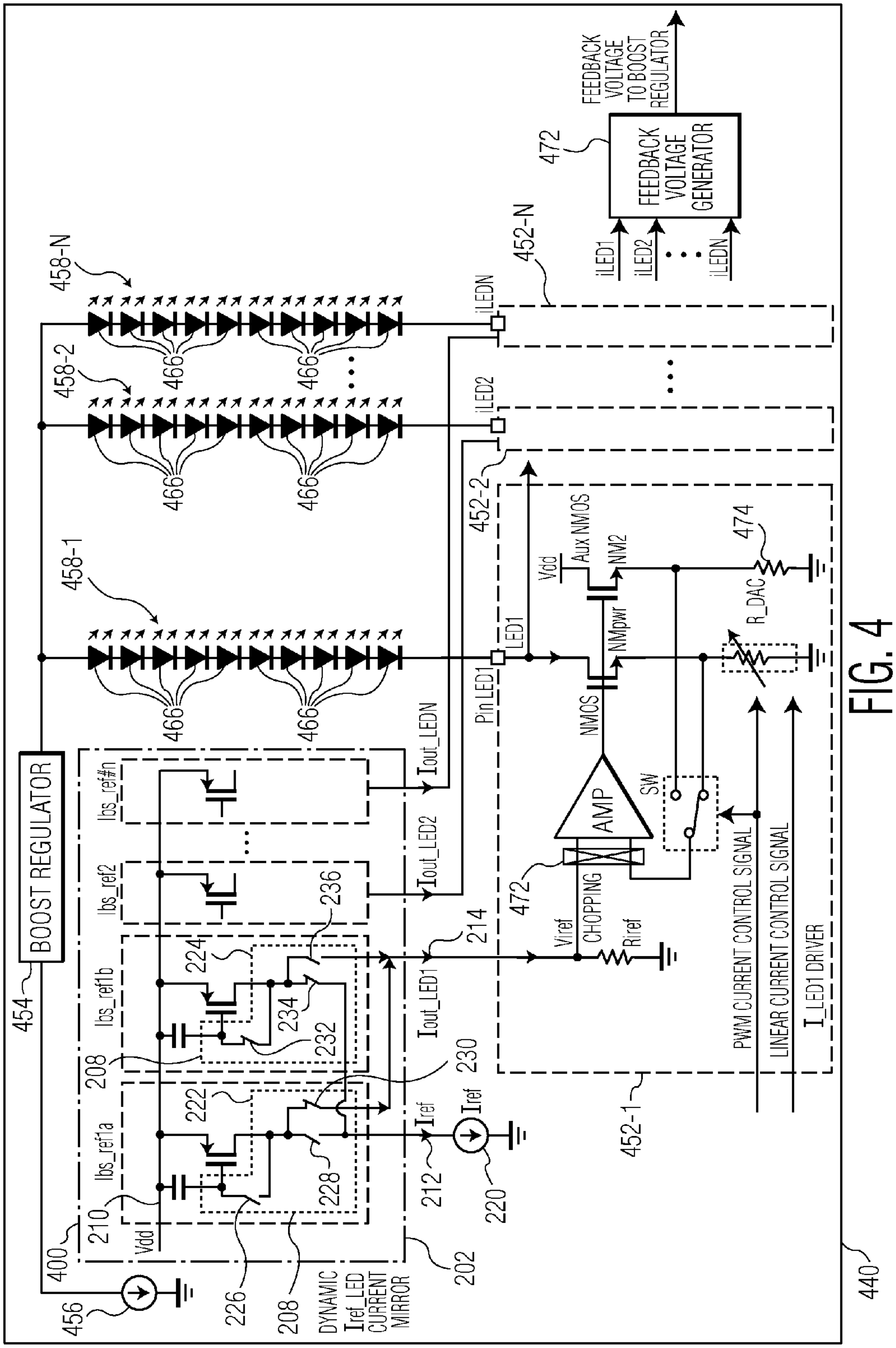
FIG. 4 depicts an embodiment of an LED system that includes a current mirror having multiple current mirror cells depicted in FIG. 2.

FIG. 4 depicts an embodiment of an LED system 440 that includes a current mirror 400 having multiple current mirror cells 202 such as the cells depicted in FIG. 2. In the embodiment depicted in FIG. 4, the LED system includes a reference current generator 420, the current mirror with multiple current mirror cells 202-1, . . . , 202-N (N being an integer that is larger than 1), multiple LED driver circuits 452-1, . . . , 452-N, a boost regulator 454, a voltage source 456, and multiple LED diode strings 458-1, . . . , 458-N. In some embodiments, one or more components of the LED system is integrated in an IC device. For example, the current mirror, the reference current generator, and the LED driver circuits may be integrated in an LED driver IC device while the LED strings are separate from the LED driver IC device. Compared to a conventional LED system that utilizes device matching techniques, the LED system can offer high LED current accuracy and low channel-to-channel mismatch.

In the LED system 440 depicted in FIG. 4, the reference current generator 420 generates a reference current, "$I_{ref}$," for one or more current mirror cells 202 of the current mirror 400.

In the LED system 440 depicted in FIG. 4, the current mirror 400 and the LED driver circuits 452-1, . . . , 452-N operate to generate constant drive currents to drive the LED strings 458-1, . . . , 458-N. In the embodiment depicted in FIG. 4, the current mirror 400 includes multiple current mirror cells 202-1, . . . , 202-N that convert the reference current, $I_{ref}$, to multiple output currents, "$I_{out\_LED1}$," "$I_{out\_LED2}$," . . . , "$I_{out\_LEDN}$," for the LED driver circuits 452-1, . . . , 452-N, respectively.

In the LED system 440 depicted in FIG. 4, the voltage source 456 is configured to generate a voltage, "Vdc." The boost regulator 454 up-converts the voltage, Vdc, into multiple voltages for the LED diode strings 458-1, . . . , 458-N. Each of the LED diode strings 458-1, . . . , 458-N includes a number of LEDs 466 that are connected in series. Although each of the LED diode strings is shown in FIG. 4 as including multiple LEDs, in other embodiments, at least one LED diode string of the LED system includes a single diode. In addition, although the LED diode strings are shown in FIG. 4 as including identical number of LEDs, in other embodiments, two or more LED diode strings of the LED system have a unique (different) number of LEDs. Further, although the LED diode strings are shown in FIG. 4 as including identical LEDs, in other embodiments, one or more LED diode strings of the LED system includes LEDs of different types or sizes.

The LED driver circuits, 452-1, . . . , 452-N, of the LED system 440 are used to generate output currents, "iLED1," "iLED2," . . . , "iLEDN," to drive the LED strings 458-1, . . . , 458-N, respectively, based on the output currents, $I_{out\_LED1}$, $I_{out\_LED2}$, . . . , $I_{out\_LEDN}$ from the current mirror 400. In some embodiments, the LED system includes an optional feedback voltage generator 472 that is configured to generate a feedback voltage for the boost regulator 454 based on the output currents, iLED1, iLED2, . . . , iLEDN, from the LED driver circuits. Although not shown in FIG. 4, current paths for the output currents, iLED1, iLED2, . . . , iLEDN, are included between the feedback voltage generator and the LED driver circuits and a voltage signal path for the feedback voltage is included between the feedback voltage generator and boost regulator.

In the embodiment depicted in FIG. 4, the LED driver circuit 452-1 includes a resistor, "R_DAC," a resistor, "$R_{iref}$," an error amplifier, "Amp," with a frequency chopping unit 472, an NMOS device, "NMpwr," an auxiliary NMOS device, "NM2," a feedback control switch, "SW," and a resistor 474. The LED driver circuit 452-1 uses a closed loop to set the voltage on the resistor, R_DAC, to be equal to the reference voltage, $V_{iref}$, that is generated by the output current, $I_{out\_LED1}$, passing through the resistor, $R_{iref}$. The closed loop is formed by the error amplifier, Amp, the NMOS device, NMpwr, the auxiliary NMOS device, NM2, and the feedback control switch, SW. As shown in FIG. 4, the resistor, R_DAC, is controlled by a linear current control signal and a Pulse-width modulation (PWM) current control signal, while the feedback control switch, SW, is controlled by the PWM current control signal. The NMOS device, NMpwr, generates an output LED current, I_LED1, which is proportional to the current, $I_{out\_LED1}$, received at the resistor, $R_{iref}$. The input offset of the error amplifier, Amp, can lead to both current accuracy of the output current, I_LED1, and channel-to-channel mismatch of LED driver output currents. The frequency chopping unit is configured to in perform frequency chopping to reduce or even remove the input offset of the error amplifier. The chopping frequency of the frequency chopping unit can be the same as the switching frequency of the boost regulator 454 such that the noise generated by the frequency chopping unit is synchronized with the switching noise of the boost regulator, which can be filtered out together if necessary. In some embodiments, the resistors, Riref, and R_DAC, are tied together to ground such that ground voltages among the LED driver circuits, 452-1, . . . , 452-N, of the LED system 440 can be even.

Figure 5:
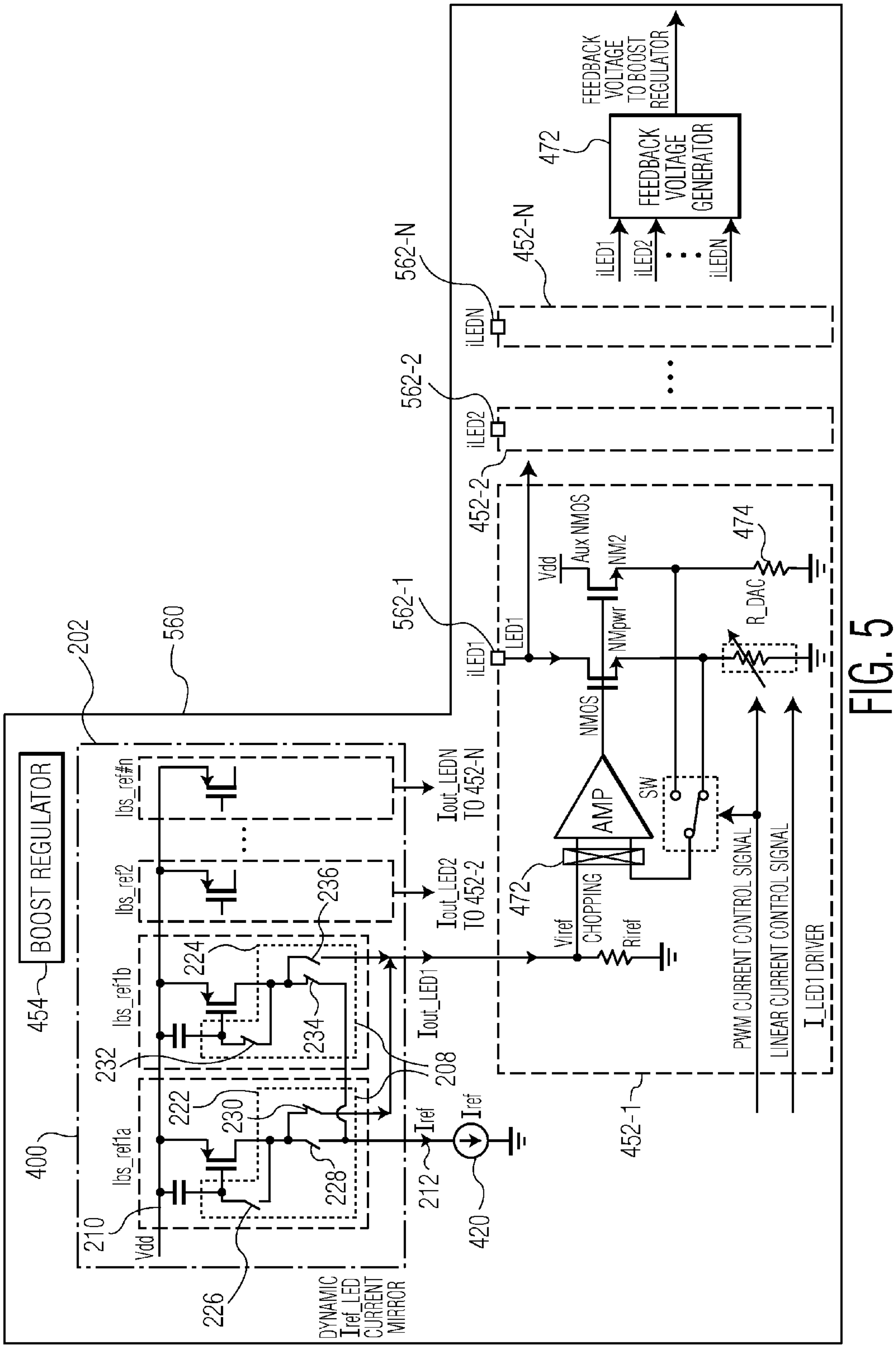
FIG. 5 depicts an embodiment of a constant-current LED driver IC device of the LED system depicted in FIG. 4.

FIG. 5 depicts an embodiment of a constant-current LED driver IC device 560 of the LED system 440 depicted in FIG. 4. In the embodiment depicted in FIG. 5, the constant-current LED driver IC device includes the current mirror 400, the reference current generator 420, the LED driver circuits, 452-1, . . . , 452-N, the feedback voltage generator 472, and the boost regulator 454. The constant-current LED driver IC device include at least pins/terminals, 562-1, . . . , 562-N, for outputting driving current for the LED strings 458-1, . . . , 458-N (shown in FIG. 4). The constant-current LED driver IC device may include more or less circuit components to realize more or less functionalities.

Although specific embodiments of the invention that have been described or depicted include several components described or depicted herein, other embodiments of the invention may include fewer or more components to implement less or more features.

In addition, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A current mirror for a constant-current light-emitting diode (LED) driver system, the current mirror comprising:

at least one current mirror cell, wherein each of the at least one current mirror cell comprises:

a plurality of semiconductor circuits configured to generate an output current based on a reference current; and a control module configured to alternately and continuously charge the semiconductor circuits in response to a plurality of non-overlapping clock signals;

wherein the semiconductor circuits include first and second semiconductor circuits, which are connected to a voltage rail, to a reference current signal path from which the reference current is received, and to a current output signal path to which the output current is output;

wherein the control module comprises a first control circuit and a second control circuit, wherein the first control circuit comprises a first set of switches connected to a gate terminal of the first semiconductor circuit, connected to the reference current signal path, and connected to the current output signal path, and wherein the second control circuit comprises a second set of switches connected to a gate terminal of the second semiconductor circuit, connected to the reference current signal path, and connected to the current output signal path.

2. The current mirror of claim 1, wherein when one of the first and second semiconductor circuits is charged by the reference current, the other one of the first and second semiconductor circuits generates the output current.

3. The current mirror of claim 2, wherein the output current is equal to the reference current over process, voltage, and temperature variations.

4. The current mirror of claim 1, wherein each of the first and second sets of switches are configured to be controlled by a first clock signal and a second clock signal, and wherein the first clock signal does not overlap with the second clock signal.

5. The current mirror of claim 4, wherein the first semiconductor circuit comprises a first PMOS device, and wherein the second semiconductor circuit comprises a second PMOS device.

6. The current mirror of claim 5, wherein the first control circuit comprises:

a first switch connected between a gate terminal of the first PMOS device and a drain terminal of the first PMOS device;

a second switch connected between the drain terminal of the first PMOS device and the reference current signal path; and a third switch connected between the drain terminal of the first PMOS device and the current output signal path.

7. The current mirror of claim 6, wherein the second control circuit comprises:

a fourth switch connected between a gate terminal of the second PMOS device and a drain terminal of the second PMOS device;

a fifth switch connected between the drain terminal of the second PMOS device and the reference current signal path; and a sixth switch connected between the drain terminal of the second PMOS device and the current output signal path.

8. The current mirror of claim 6, wherein the first, second, and sixth switches are configured to be controlled by the first clock signal, and wherein the third, fourth, and fifth switches are configured to be controlled by the second clock signal.

9. A constant-current LED driver integrated circuit (IC) device comprising the current mirror of claim 1, a reference current generator, and a plurality of LED driver circuits.

10. The constant-current LED driver IC device of claim 9, wherein each of the LED driver circuits comprises a plurality of resistors, an error amplifier, and a plurality of switches.

11. The constant-current LED driver IC device of claim 10, wherein the error amplifier comprises a frequency chopping unit configured to perform frequency chopping to reduce an input offset of the error amplifier.

12. A LED system comprising the constant-current LED driver IC device of claim 9 and a plurality of LED diode strings.

13. A constant-current light-emitting diode (LED) driver integrated circuit (IC) device comprising:

a current mirror comprising a plurality of current mirror cells, wherein each of the current mirror cells comprises:

a first PMOS device and a second PMOS device configured to generate an output current based on a reference current; and a control module configured to alternately and continuously charge the first and second PMOS devices in response to a plurality of non-overlapping clock signals;

a reference current generator configured to generate the reference current; and a plurality of LED driver circuits configured to generate LED driving currents based on output currents generated by the current mirror.

14. The constant-current LED driver IC device of claim 13, wherein each of the LED driver circuits comprises a plurality of resistors, an error amplifier, and a plurality of switches.

15. The constant-current LED driver IC device of claim 14, wherein the error amplifier comprises a frequency chopping unit configured to perform frequency chopping to reduce an input offset of the error amplifier.

16. A current mirror for a constant-current light-emitting diode (LED) driver system, comprising:

at least one current mirror cell;

wherein each of the at least one current mirror cell comprises, a plurality of semiconductor circuits configured to generate an output current based on a reference current; and a control module configured to alternately and continuously charge the semiconductor circuits in response to a plurality of non-overlapping clock signals;

a reference current generator; and a plurality of LED driver circuits.

* * * * *